US012813273B2

United States Patent
Zhao et al.

(10) Patent No.: US 12,813,273 B2
(45) Date of Patent: Nov. 24, 2026

(54) THERMAL-ENHANCED POWER MODULE WITH SEPARATE HEAT SPREADERS

(71) Applicant: Monolithic Power Systems, Inc., Kirkland, WA (US)

(72) Inventors: Xin Zhao, San Jose, CA (US); Di Han, San Jose, CA (US)

(73) Assignee: Monolithic Power Systems, Inc., Kirkland, WA (US)

(*) Notice: Subject to any disclaimer, the term of this patent is extended or adjusted under 35 U.S.C. 154(b) by 362 days.

(21) Appl. No.: 18/389,903

(22) Filed: Dec. 20, 2023

(65) Prior Publication Data

US 2025/0210449 A1 Jun. 26, 2025

(51) Int. Cl.

| | |
|---|---|
| ***H10W 40/60*** | (2026.01) |
| ***H02M 1/00*** | (2007.01) |
| ***H05K 1/03*** | (2006.01) |
| ***H05K 7/20*** | (2006.01) |
| ***H10W 40/20*** | (2026.01) |
| ***H10W 90/00*** | (2026.01) |

(52) U.S. Cl.

CPC .......... *H10W 40/613* (2026.01); *H05K 7/209* (2013.01); *H10W 90/00* (2026.01); *H05K 1/0346* (2013.01); *H05K 2201/0154* (2013.01); *H05K 2201/1003* (2013.01); *H05K 2201/10166* (2013.01); *H05K 2201/10189* (2013.01); *H05K 2201/10515* (2013.01); *H05K 2201/10522* (2013.01); *H05K 2201/10545* (2013.01); *H10W 40/237* (2026.01); *H10W 90/731* (2026.01)

(58) Field of Classification Search

CPC ......... H05K 1/0209; H05K 2201/1003; H05K 2201/10416; H05K 7/20; H05K 7/2089; H05K 7/209; H05K 7/20909; H05K 7/2039; H05K 2201/10515; H01F 27/2852; H01F 27/22; H01F 17/00; H01F 27/292; H10W 40/22–25; H10W 90/754; H10W 44/501; H02M 3/003

See application file for complete search history.

(56) References Cited

U.S. PATENT DOCUMENTS

| | | | | |
|---|---|---|---|---|
| 10,361,631 | B2 | 7/2019 | Zhou et al. | |
| 10,581,327 | B2 | 3/2020 | Zhou et al. | |
| 10,693,378 | B2 | 6/2020 | Zhou et al. | |
| 2021/0321527 | A1* | 10/2021 | Ma | H05K 7/209 |
| 2022/0393594 | A1 | 12/2022 | Han et al. | |
| 2023/0179100 | A1 | 6/2023 | Han et al. | |

* cited by examiner

*Primary Examiner* — Sonya McCall-Shepard

(74) *Attorney, Agent, or Firm* — Ashurst Perkins Coie US LLP

(57) ABSTRACT

A power module has a substrate, and an inductor assembly, a first plurality of power integrated circuits (ICs), a first and second heat spreaders which are all mounted on a first surface of the substrate. The inductor assembly has a main body with a bottom surface facing the first surface of the substrate surface. The first plurality of power ICs are under the main body of the inductor assembly. A distance between the bottom surface of the main body of the inductor assembly and the first surface of the substrate is larger than heights of the first plurality of power ICs. The first heat spreader has a first insertion portion inserted between the main body of the inductor assembly and the first plurality of power ICs, and the first insertion portion is in contact with the second heat spreader through a thermal interface material (TIM).

18 Claims, 11 Drawing Sheets

THERMAL-ENHANCED POWER MODULE WITH SEPARATE HEAT SPREADERS

BACKGROUND OF THE INVENTION

1. Field of the Invention

The present invention generally relates to electronic components, and more particularly, relates to heat spreaders of power modules.

2. Description of Related Art

A power module comprises power converters that are implemented on a substrate, such as a printed circuit board (PCB). Power modules may be employed to provide one or more voltages to supply various electrical devices. To improve integration, power modules needs to be smaller, and it is an effective way to layout components of the power module in a vertical direction. For example, power integrated circuits (power ICs) may be soldered on one or both sides of a printed circuit board (PCB), and an inductor may be put on top of the power module.

In high power applications, larger current and smaller size put more challenges to the heat dissipation. Therefore, it is desirable to provide a power module with high-power density, high-efficiency, and excellent heat dissipation capability in space-constrained environments.

SUMMARY OF THE INVENTION

It is an object of the present invention to provide a power module with a plurality of heat spreaders to enhance thermal performance of the power module.

Embodiments of the present invention are directed to a power module, having a substrate, a first plurality of power integrated circuits (ICs), a second plurality of power ICs, an inductor assembly, a first heat spreader, a second heat spreader, and a third heat spreader. The substrate has a first surface and a second surface. The first plurality of power ICs are mounted on the first surface of the substrate. The second plurality of power ICs are mounted on the second surface of the substrate. The inductor assembly has a main body, a first terminal and a second terminal. The main body of the inductor assembly has a bottom surface facing the substrate and a top surface facing away from the substrate. The first and second terminals of the inductor assembly extends from the main body of the inductor assembly and are connected to the first surface of the substrate, and wherein the inductor assembly is coupled to a switch node formed by the first and second plurality of power ICs. The first heat spreader and the second heat spreader are mounted on the first surface of the substrate, wherein the first plurality of power ICs are under the main body of the inductor assembly, and a distance between the bottom surface of the main body of the inductor assembly and the first surface of the substrate is larger than heights of the first plurality of power ICs. The first heat spreader has a first insertion portion inserted between the main body of the inductor assembly and the first plurality of power ICs, and the first insertion portion is in contact with the second heat spreader through a thermal interface material (TIM). The third heat spreader is mounted on the second surface of the substrate to cover the second plurality of power ICs.

Embodiments of the present invention are directed to a power module, having a substrate, an inductor assembly, a first plurality of power ICs, a first heat spreader and a second heat spreader. The substrate has a first surface and a second surface. The inductor assembly has a main body, a first terminal and a second terminal. The main body of the inductor assembly has a bottom surface facing the first surface of the substrate surface and a top surface opposite to the bottom surface of the main body of the inductor assembly, wherein the first and second terminals of the inductor assembly extends from the main body of the inductor assembly and are connected to the first surface of the substrate. The first plurality of power ICs are mounted on the first surface of the substrate, wherein the first plurality of power ICs are under the main body of the inductor assembly, and a distance between the bottom surface of the main body of the inductor assembly and the first surface of the substrate is larger than heights of the first plurality of power ICs. The first heat spreader and the second heat spreader are mounted on the first surface of the substrate, wherein the first heat spreader has a first insertion portion inserted between the main body of the inductor assembly and the first plurality of power ICs, and the first insertion portion is in contact with the second heat spreader through a TIM.

Embodiments of the present invention are directed to a heat dissipation method for a power module. The power module comprises a substrate having a first surface and a second surface, a first plurality of power ICs mounted on the first surface of the substrate and an inductor assembly mounted on the first surface of the substrate. The inductor assembly has a main body placed above the first plurality of power ICs. The heat dissipation method comprises dissipating heat generated by the first plurality of power ICs to a first heat spreader, dissipating the heat generated by the first plurality of power ICs from the first heat spreader partially to a second heat spreader, and dissipating the heat generated by the first plurality of power ICs from the first heat spreader and second heat spreader to top of the power module. Wherein the first heat spreader has an insertion portion inserted between the main body of the inductor assembly and the first plurality of power ICs, and the insertion portion is in contact with the second heat spreader. The first heat spreader is in contact with the second heat spreader through a TIM, and the first heat spreader is in contact with the first plurality of power ICs through the TIM.

These and other features of the present invention will be readily apparent to persons of ordinary skill in the art upon reading the entirety of this disclosure, which includes the accompanying drawings and claims.

BRIEF DESCRIPTION OF DRAWINGS

The present invention can be further understood with reference to the following detailed description and the appended drawings, wherein like elements are provided with like reference numerals.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1:
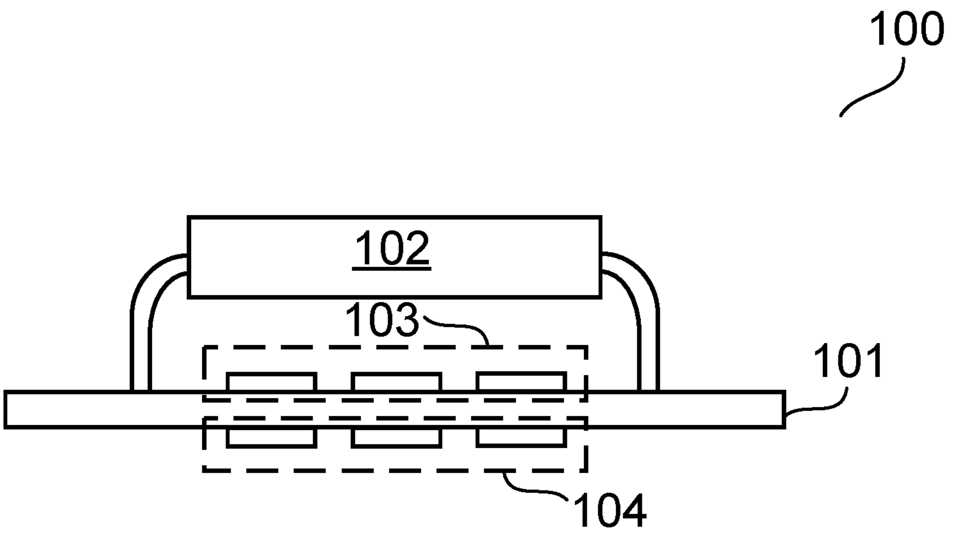
FIG. 1 (Prior Art)
FIG. 1 shows a conventional power module 100.

FIG. 1 shows a conventional power module 100. In power modules formed by multi-level switching converters or high-current switching converters, the power module may comprise a plurality of power integrated circuits (ICs) and an inductor. For example, the power module 100 shown in FIG. 1 has a substrate 101 with a top surface and a bottom surface, an inductor 102, a first plurality of power ICs 103, and a second plurality of power ICs 104. FIG. 1 illustrates an “inductor-on-top” package, i.e., the inductor 102 is placed on top of the power module 100 to reduce the footprint of the power module 100, therefore the package shown in FIG. 1 is widely used in power modules with high power density. To further reduce a size of the power module 100, the first plurality of power ICs 103 may be placed under the inductor 102 on the top surface of the substrate 101, and the second plurality of power ICs 104 may be placed on the bottom surface of the substrate 101, as shown in FIG. 1. In some applications, the power module 100 may be molded by a molding compound.

Though the power module 100 has a small size, the package shown in FIG. 1 has some drawbacks in terms of heat dissipation. Since there is a gap between the inductor 102 and the first plurality of power ICs 103, heat generated by the first plurality of power ICs 103 is first dissipated via air or via the molding compound. Besides, a portion of heat generated by the second plurality of ICs 104 is dissipated downwards via air or via the molding compound, and another portion of the heat generated by the second plurality of ICs 104 is dissipated upwards first through substrate 101 and then via air or the molding compound. However, both air and the molding compound have relatively low thermal conductivity, which is adverse to heat dissipation of the first plurality of power ICs 103, thus thermal performance of the power module 100 may need improvement.

Embodiments of the present invention provides a power module with a plurality of separate heat spreaders to enhance thermal performance of the power module.

Figure 2:
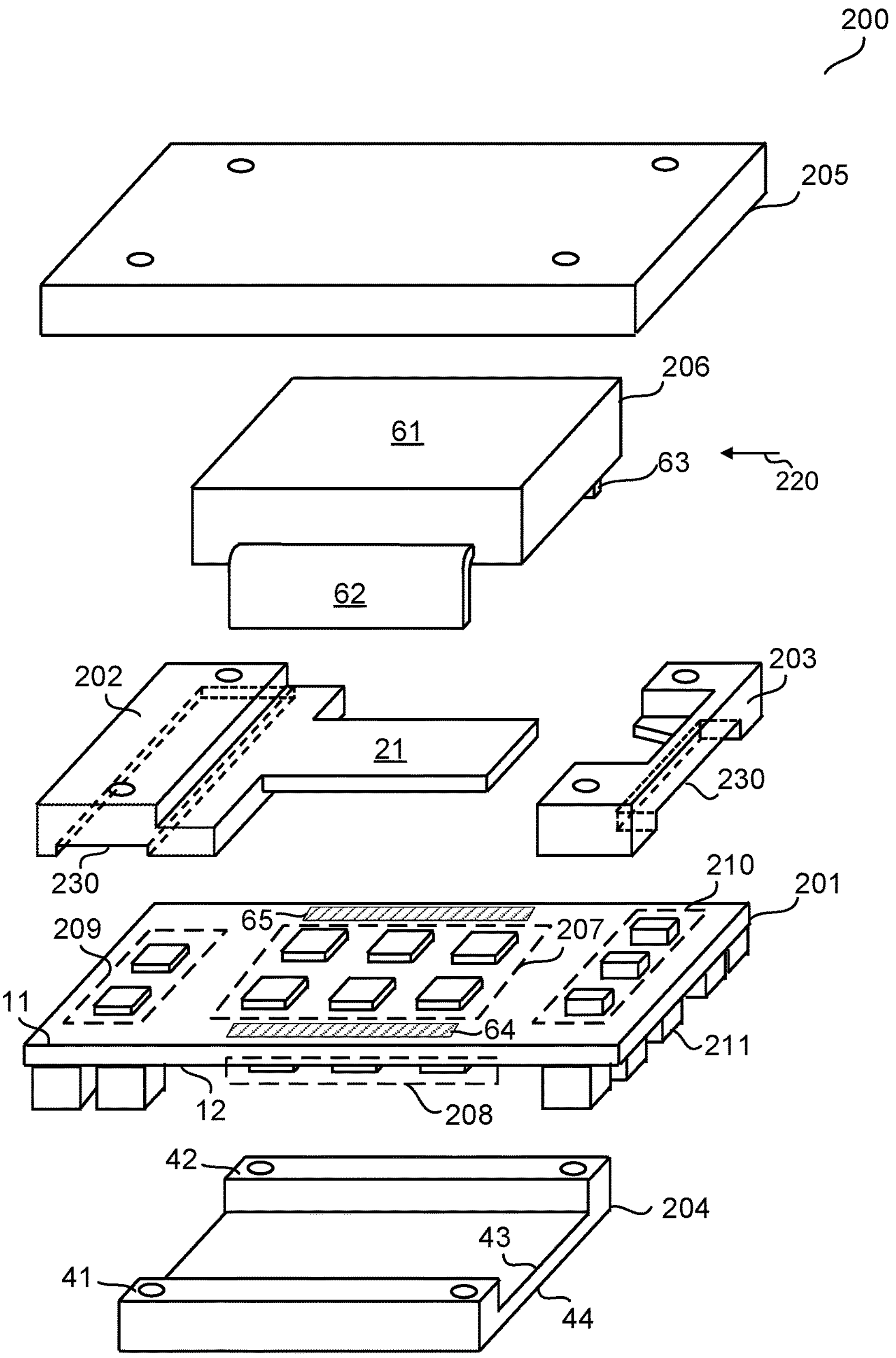
FIG. 2 shows an explosive view of a power module 200 in accordance with an embodiment of the present invention.

FIG. 2 shows an explosive view of a power module 200 in accordance with an embodiment of the present invention. As shown in FIG. 2, the power module 200 comprises a substrate 201, heat spreaders 202-204, and an inductor assembly 206. The substrate 201 has a top surface 11 and a bottom surface 12, and the inductor assembly 206 is on the top surface 11 of the substrate 201. In the example of FIG. 2, the power module 200 further comprises a plurality of power integrated circuits (ICs) 207 mounted on the top surface 11 of the substrate 201, a plurality of power ICs 208 mounted on the bottom surface 12 of the substrate 201.

In the example of FIG. 2, the inductor assembly 206 has a main body 61, a terminal 62 and a terminal 63. The main body 61 of the inductor assembly 206 has a bottom surface facing the substrate 201 and a top surface facing away from the substrate 201. The main body 61 of the inductor assembly 206 is above the substrate 201. The terminals 62 and 63 of the inductor assembly 206 extends from the main body 61 and are connected to the top surface 11 of the substrate 201 to fix the inductor assembly 206 onto the substrate 201. The terminals 62 and 63 of the inductor assembly 206 are further configured to couple the inductor assembly 206 to a switch node formed by at least two power ICs of the plurality of power ICs 207 and 208. As shown in FIG. 2, a shaded area 64 marked on the top surface 11 of the substrate 201 shows an area of contact between the terminal 62 and the substrate 201, and a shaded area 65 marked on the top surface 11 of the substrate 201 shows an area of contact between the terminal 63 and the substrate 201, such that the plurality of power ICs 207 are placed under the main body 61 of the inductor assembly 206, and a distance between the bottom surface of the main body 61 and the top surface 11 of the substrate 201 is larger than heights of the plurality of power ICs 207.

In the example of FIG. 2, the heat spreaders 202 and 203 are mounted on the top surface 11 of the substrate 201. The heat spreader 202 has an insertion portion 21 inserted between the main body 61 of the inductor assembly 206 and the plurality of power ICs 207, that is the main body 61 of the inductor assembly 206 and the plurality of power ICs 207 are respectively located on both sides of the insertion portion 21. The insertion portion 21 is in contact with the heat spreader 203 through a thermal interface material (TIM), as will be later explained beginning with FIG. 6. In the example of FIG. 2, each of the heat spreaders 202 and 203 has a bottom surface connected to the top surface 11 of the substrate 201. Each of the heat spreaders 202 and 203 has at least one cavity 230 disposed on the bottom surfaces of the heat spreaders 202 and 203 to provide space for the non-power ICs 209 and the passive devices 210, thus the heat spreaders 202 and 203 are mounted on the substrate 201 without pressing the non-power ICs 209 and the passive devices 210. One with ordinary skill in the art should understand that number, sizes, and shapes of the cavities 230 are not limited by the example of FIG. 2. The heat spreader 204 is mounted on the bottom surface 12 of the substrate 201 to cover the plurality of power ICs 208, and to dissipate the heat generated by the plurality of power ICs 208. In one example, the heat spreader 204 has two contact surfaces 41 and 42 which are connected to the bottom surface 12 of the substrate 201 to fix the heat spreader 204 onto the substrate 201. The heat spreader 204 further has an inner surface 43 facing the substrate 201 and an outer surface 44 facing away from the substrate 201, and the inner surface 41 of the heat spreader 204 is in contact with the plurality of power ICs 208 through the TIM. Compared with conventional power modules which usually put only one external heat sink on top of the module, the separate heat spreaders 202-205 used in the power module 200 of the present invention reduce overlap of the heat flow paths of the plurality of power ICs 207 and 208, and the inductor 102, i.e., thermal fields of all these components also feature less overlap by utilizing.

In the example of FIG. 2, the power module 200 further comprises a plurality of non-power ICs 209, a plurality of passive devices 210, and a plurality of connectors 211 (not all of the connectors 211 are labeled for clarity of illustration). The plurality of non-power ICs 209, the plurality of passive devices 210, and the plurality of connectors 211 are mounted on one or both of the top surface 11 and the bottom surface 12 of the substrate 201. In one embodiment, the plurality of power ICs 207 may comprise metal oxide semiconductor field effect transistors (MOSFETs), the plurality of non-power ICs 209 may comprise at least one controller IC to control the plurality of power ICs 207 and 208, gate driver ICs to drive the plurality of power ICs 207 and 208, and low dropout regulator (LDO) ICs, etc., the passive devices 210 may comprise capacitors, resistors, and diodes, etc., and the connectors 211 may comprise pin headers and metal pillars, etc. In one embodiment, the substrate 201 comprises a printed circuit board (PCB), e.g., a BT PCB (i.e., a PCB fabricated using bismaleimide triazine resin material).

In one embodiment, the power module 200 further comprises a heat spreader 205 mounted on the substrate 201. The heat spreader 205 is placed on top of the inductor assembly 206, and is in contact with the heat spreader 202, the heat spreader 203, and the top surface of the main body 61 through the TIM. In one embodiment, an external heat sink is placed on top of the heat spreader 205, and a topmost surface of the heat spreader 205 provides an even plane for the installation of the external heat sink. In a convention power module, e.g., the power module 100 shown in FIG. 1, installation of the external heat sink requires relatively high evenness of the top surface of the inductor 102, which is difficult to achieve by common manufacturing and assembly processes of the inductor. In the embodiments of the present invention, the heat spreader 205 used in the power module 200 provides an even topmost surface for the installation of the external heat sink.

Figure 3:
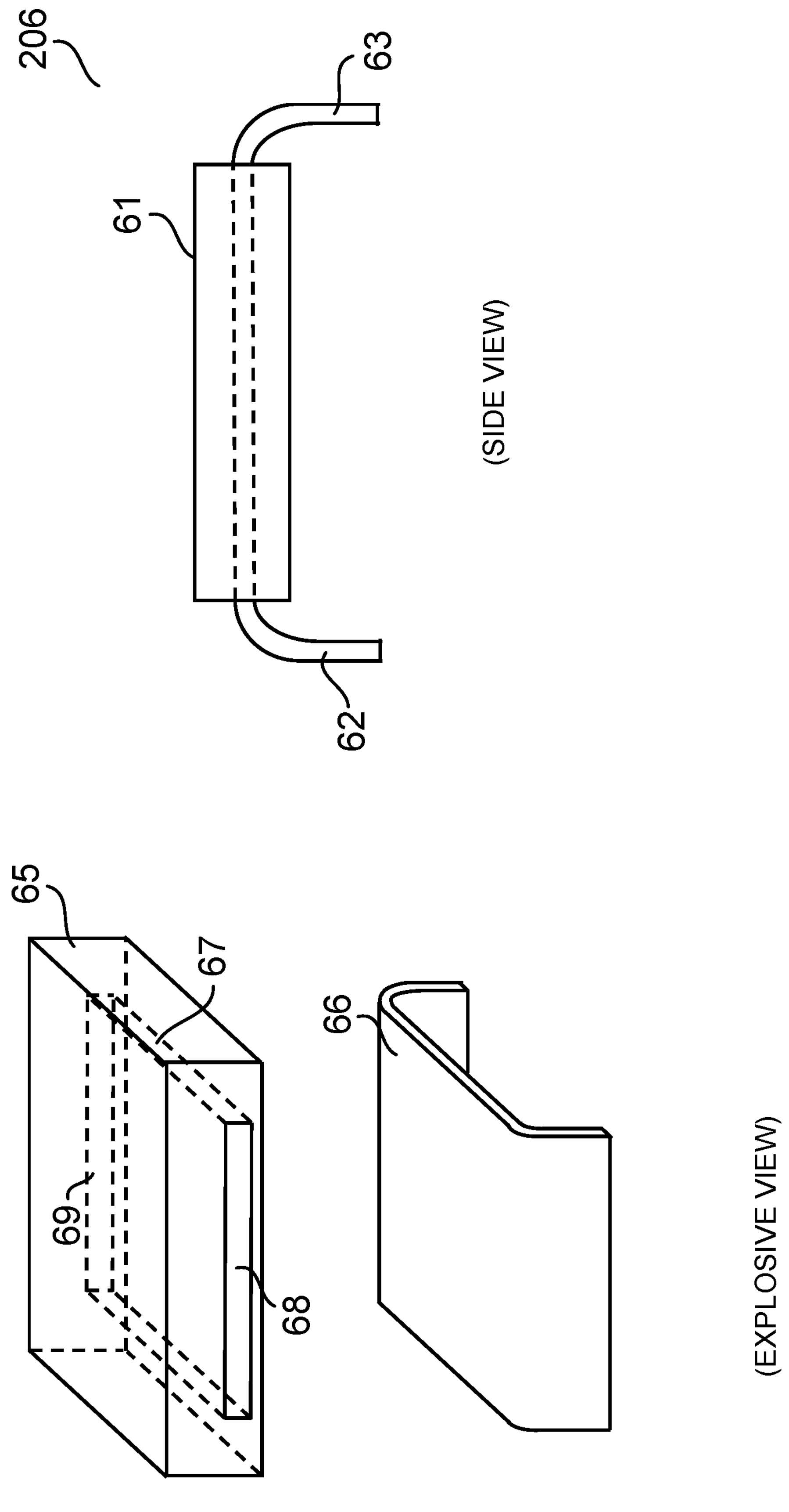
FIG. 3 shows a side view and an explosive view of an inductor assembly 206 in accordance with an embodiment of the present invention.

FIG. 3 shows, from left to right, a side view and an explosive view of the inductor assembly 206 in accordance with an embodiment of the present invention. In the example of FIG. 3, the inductor assembly 206 comprises a magnetic core 65 and a winding 66. A channel 67 forms inside of the magnetic core 65, and the channel forms a first window 68 on a first side surface of the magnetic core 65 and a second window 69 on a second side surface of the magnetic core 65 which is opposite to the first side surface. The side view of the inductor assembly 206 in FIG. 3 is viewed in the direction of an arrow 220 shown in FIG. 2. As shown in the side view of the inductor assembly 206, the winding 66 passes through the channel 67, a first portion of the winding 66 extends out of the magnetic core 65 through the first window 68 to form the terminal 62 of the inductor assembly 206, and a second portion of the winding 66 extends out of the magnetic core 65 through the second window 69 to form the terminal 63 of the inductor assembly 206. A third portion of the winding 66, which is represented by dashed lines in the side view of the inductor assembly 206, is inside of the magnetic core 65, and the magnetic core 65 and the third portion of the winding 66 form the main body 61 of the inductor assembly 206. One with ordinary skill in the art should understand that the winding 66 of the inductor assembly 206 is not limited by the example of FIG. 3, other types of windings may also be applied in other embodiments of the present invention.

Figure 4:
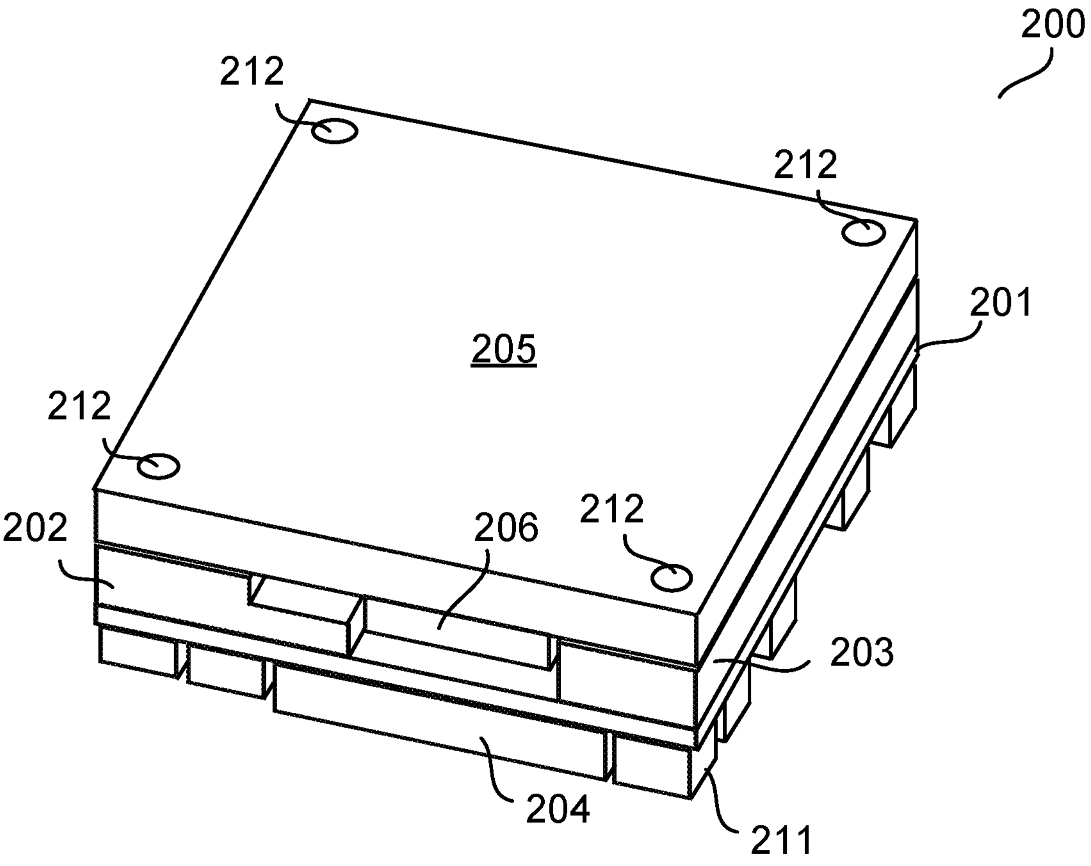
FIG. 4 shows a three-dimensional view of the power module 200 in accordance with an embodiment of the present invention.

FIG. 4 shows a three-dimensional view of the power module 200 in accordance with an embodiment of the present invention. In one embodiment, the heat spreaders 202-205 are fixed by screws, e.g., the heat spreaders 202, 203, and 205 are fixed onto the top surface 11 of the substrate 201 by screws 212 as shown in FIG. 3, and the heat spreader 204 is fixed onto the bottom surface 12 of the substrate 201 also by screws (not shown in FIG. 3). One with ordinary skill in the art should understand that the method of fixing the heat spreaders 202-205 is not limited by the example of FIG. 3, any suitable fixing method may also be employed without detracting merits of the present invention. In one embodiment, the power module 200 or part of the power module 200 is covered by molding compound.

Figure 5:
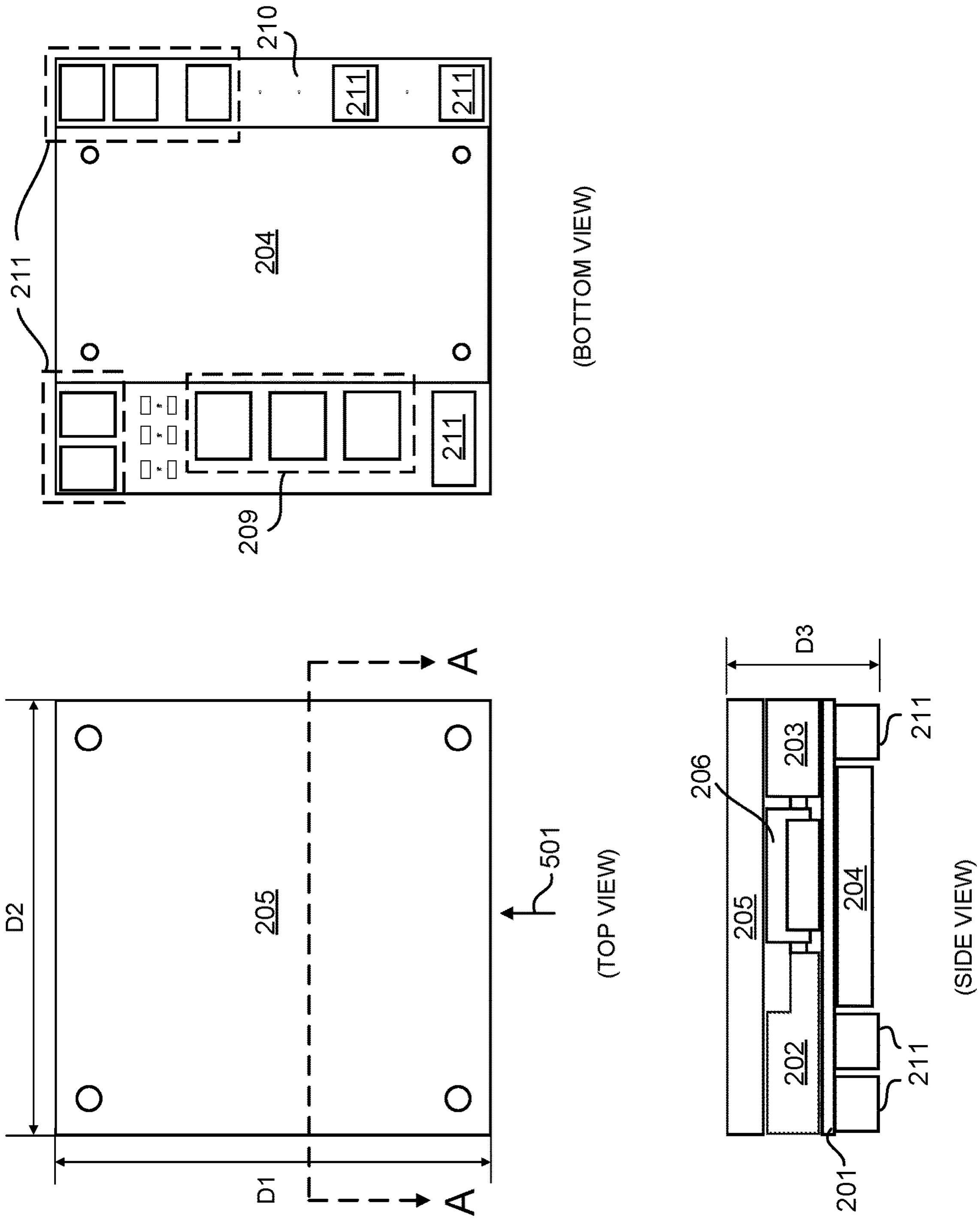
FIG. 5 shows a top view, a bottom view, and a side view of the power module 200 of FIG. 4 in accordance with an embodiment of the present invention.

FIG. 5 shows, from the upper left-hand corner in clockwise direction, a top view, a bottom view, and a side view of the power module 200 of FIG. 4 in accordance with an embodiment of the present invention. The top view of the power module 200 shows the heat spreader 205, the heat spreader 205 covers all the components of the power module 200 below the heat spreader 205, and has a length D1 and a width D2. In the example of FIG. 5, the length D1 is also a length of the power module 200, and the width D2 is also a width of the power module 200. The side view of the power module 200 is viewed in the direction of an arrow 501 shown in FIG. 5. In the example of FIG. 5, the heat spreader 205 is the tallest component mounted on the top surface 11 of the substrate 201, and the connectors 211 are the tallest components mounted on the bottom surface 12 of the substrate 201. A height D3 is a height of the power module 200, which is measured from the topmost surface in vertical direction of the heat spreader 205 to a bottommost surface in vertical direction of the connectors 211. The height D3, the width D2 and the length D1 of the power module 200 depend on designs for various applications. In one embodiment, the length D1 and the width D2 of the power module 200 are both in a range of 15-80 mm, and the height D3 of the power module 200 is in a range of 8-15 mm. In another embodiment, the length D1 of the power module 200 is in a range of 20-40 mm, and the width D2 of the power module 200 is in a range of 15-40 mm.

In the example of FIG. 5, the bottom view of the power module 200 shows the heat spreader 204, at least one of the non-power ICs 209, at least one of the passive devices 210, and at least one of the plurality of connectors 211. Not all of the passive devices 209 are labeled for clarity of illustration. One with ordinary skill in the art should understand that shapes of the heat spreader 202-205 and the layout of all the components of the power module 200 is not limited by the embodiments shown in FIG. 2, FIG. 4, and FIG. 5.

Figure 6:
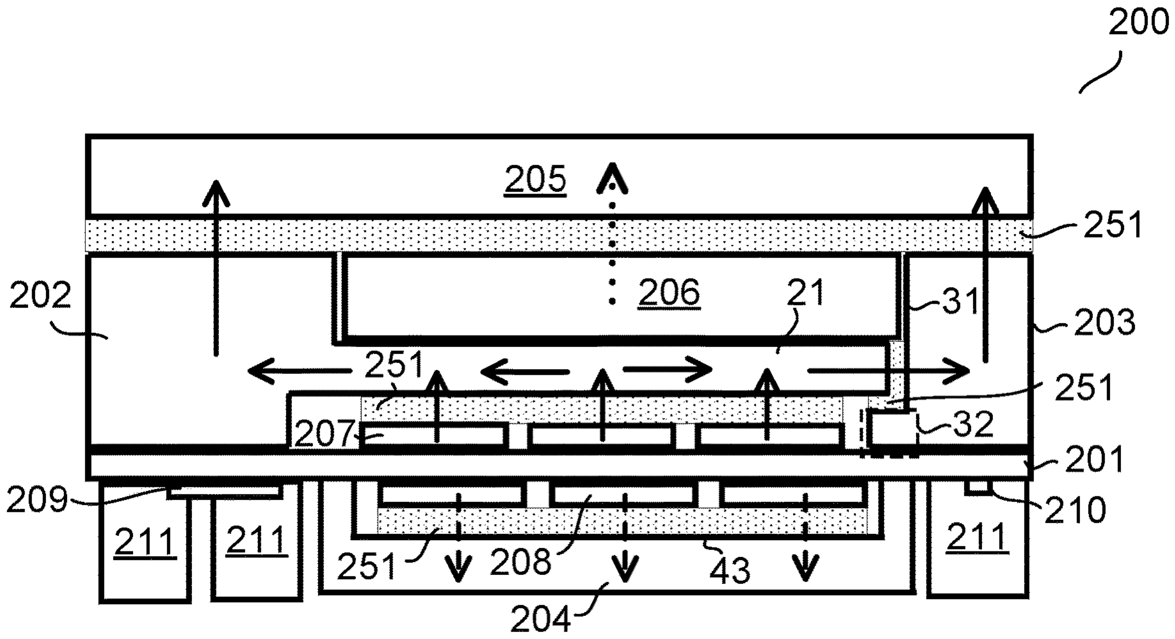
FIG. 6 shows a cross-sectional view of the power module 200 of FIG. 4 in accordance with an embodiment of the present invention.

FIG. 6 shows a cross-sectional view of the power module 200 of FIG. 4 in accordance with an embodiment of the present invention. FIG. 6 is taken at a cross-section A-A shown in FIG. 5. As shown in FIG. 6, the insertion portion 21 of the heat spreader 202 is inserted between the bottom surface of the main body 61 and topmost surfaces of the first plurality of power ICs 207. The heat spreader 203 has an inner surface 31 touching the leading end of the insertion portion 21, and at least one lap joint 32 which is partially overlapped with the insertion portion 21 in horizontal direction, and the insertion portion 21 is in contact with the at least one lap joint 32 and the inner surface 31 of the heat spreader 203 through a TIM 251. A bottommost surface of the insertion portion 21 is in contact with the plurality of power ICs 207 through the TIM 251, and the inner surface 43 of the heat spreader 204 is in contact with the plurality of power ICs 208 also through the TIM 251. The TIM 251 is further disposed on the top surface of the main body 61, a topmost surface of the heat spreader 202, and a topmost surface of the heat spreader 203, and the heat spreader 205 is in contact with the top surface of the main body 61, the topmost surface of the heat spreader 202, and the topmost surface of the heat spreader 203 through the TIM 251.

It is to be noted that, shapes and sizes of the TIM 251 filled between any two faces of the power module 200 shown in FIG. 6 are only for clarity of illustration. In some embodiments, the TIM 251 applied to the power module 200 may comprise thermal sheet, thermal pad, and thermal grease type or thermal putty type of dispensable materials. In one embodiment, the TIM 251 filled between any two faces of the power module 200 finally forms a thin layer with a thickness range of 0.02 to 2 mm, typically in a range of 0.1-0.3 mm. In one embodiment, thermal conductivity of the TIM is in a range of 1 K/mW to 20 K/mW, typically in a range of 6 K/mW to 20 K/mW.

In the example of FIG. 6, the TIM 251 with high thermal conductivity is for heat dissipation. When the power module 200 is working to provide an output voltage and an output current to a load, the inductor assembly 206, the plurality of power ICs 207, and the plurality of power ICs 208 are main components generating heat in the power module 200 (not all of the plurality of power ICs 207 and 208 are labeled in FIG. 6 for clarity of illustration). Arrows in FIG. 6 show main heat flow paths of the power module 200. As shown by an arrow with dotted line in FIG. 6, most of heat generated by the inductor assembly 206 is directly dissipated to the heat spreader 205. As shown by arrows with solid lines in FIG. 6, most of heat generated by the plurality of power ICs 207 is first dissipated to the insertion portion 21 of the heat spreader 202, then is dissipated to the heat spreader 205 partially via the heat spreader 202, and partially via the heat spreader 203, thus at least a portion of the heat generated by the plurality of power ICs 207 is finally dissipated to top of the power module 200 without passing the inductor assembly 206. As shown by arrows with dashed lines in FIG. 6, most of heat generated by the plurality of power ICs 208 is dissipated to the heat spreader 204.

In the embodiments of the present invention, combination of the heat spreaders 202 and 203 provides low thermal resistance for heat dissipation of the plurality of power ICs 207, and the heat spreader 204 provides low thermal resistance for heat dissipation of the plurality of power ICs 208. The heat spreaders 202-205 of the present invention redistribute the heat flow paths of the heat generating components disposed on different area of the power module 200, reducing overlap of the heat flow paths, and thus enhance the thermal performance of the power module 200. Besides, the topmost surface of the heat spreader 205 provides an even plane for the installation of the external heat sink.

Figure 7:
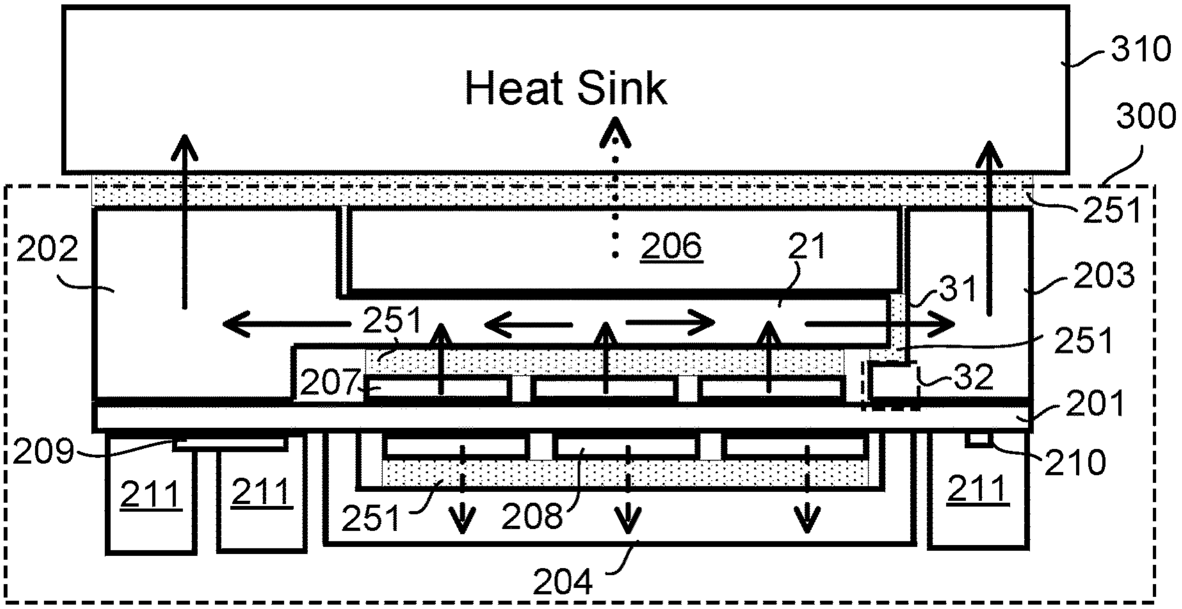
FIG. 7 shows a cross-sectional view of a power module 300 in accordance with another embodiment of the present invention.

FIG. 7 shows a cross-sectional view of a power module 300 in accordance with another embodiment of the present invention. In the example of FIG. 7, the heat spreader 205 is omitted and replaced by a heat sink 310 installed outside the power module 300, and not all of the plurality of power ICs 207 and 208 are labeled for clarity of illustration. Arrows in FIG. 7 show main heat flow paths of the power module 300. As shown by the arrow with dotted line in FIG. 7, most of the heat generated by the inductor assembly 206 is directly dissipated to the heat sink. As shown by the arrow with solid line in FIG. 7, most of the heat generated by the plurality of power ICs 207 is first dissipated to the insertion portion 21 of the heat spreader 202, then is dissipated to the heat sink partially via the heat spreader 202, and partially via the heat spreader 203.

Figure 8:
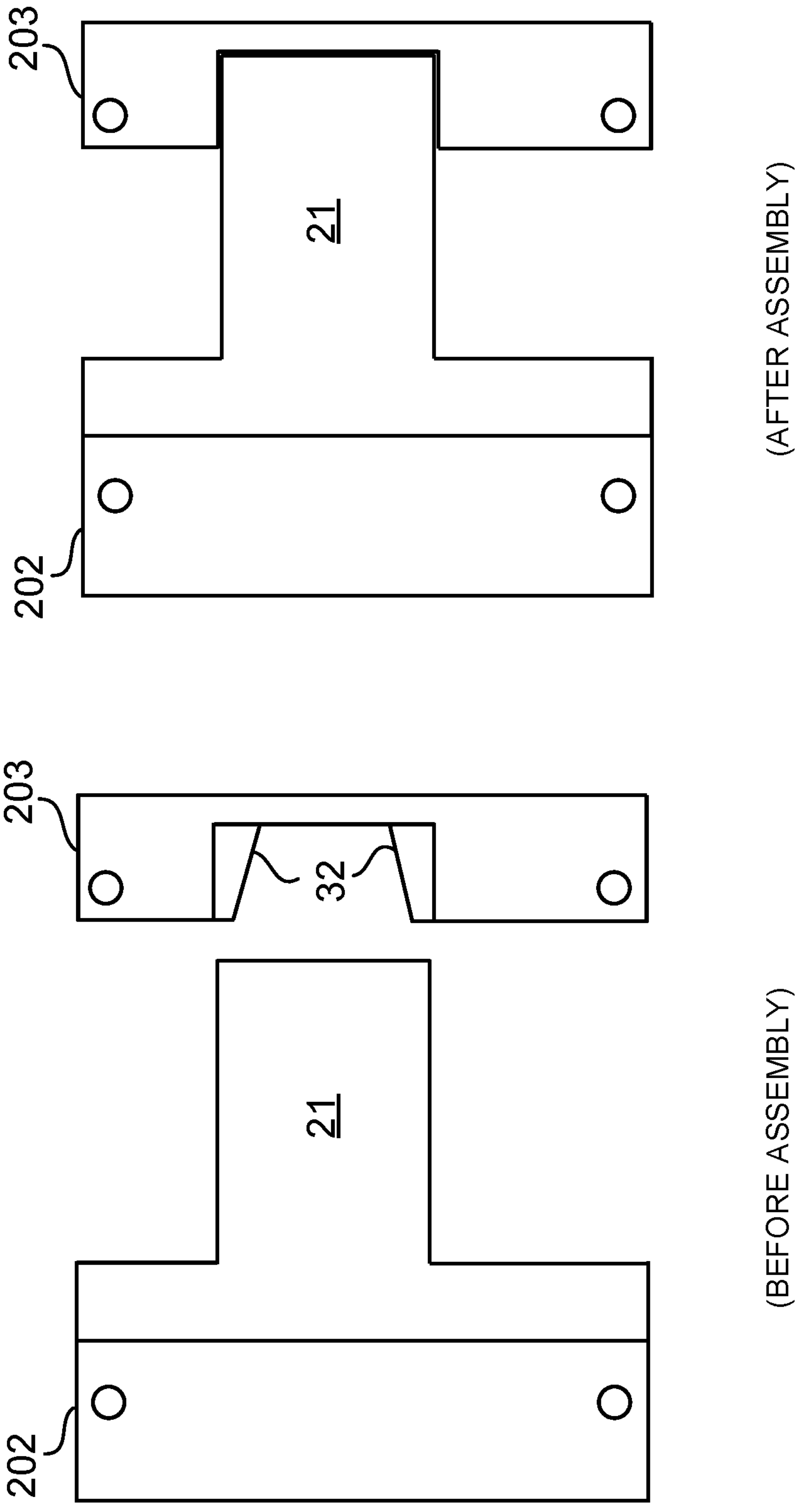
FIG. 8 shows a top view of the heat spreader 202 and the heat spreader 203 before and after assembly in accordance with an embodiment of the present invention.

FIG. 8 shows, from left to right, a top view of the heat spreader 202 and the heat spreader 203 before and after assembly in accordance with an embodiment of the present invention. In the example of FIG. 8, the heat spreader 203 has two lap joints 32. One with ordinary skill in the art should understand that the number and detailed structure of the at least one lap joint 32 is not limited by the example of FIG. 8. In another embodiment, the heat spreader 203 may have only one lap joint 32 or more than two lap joints 32 to assembly with the heat spreader 202.

Figure 9:
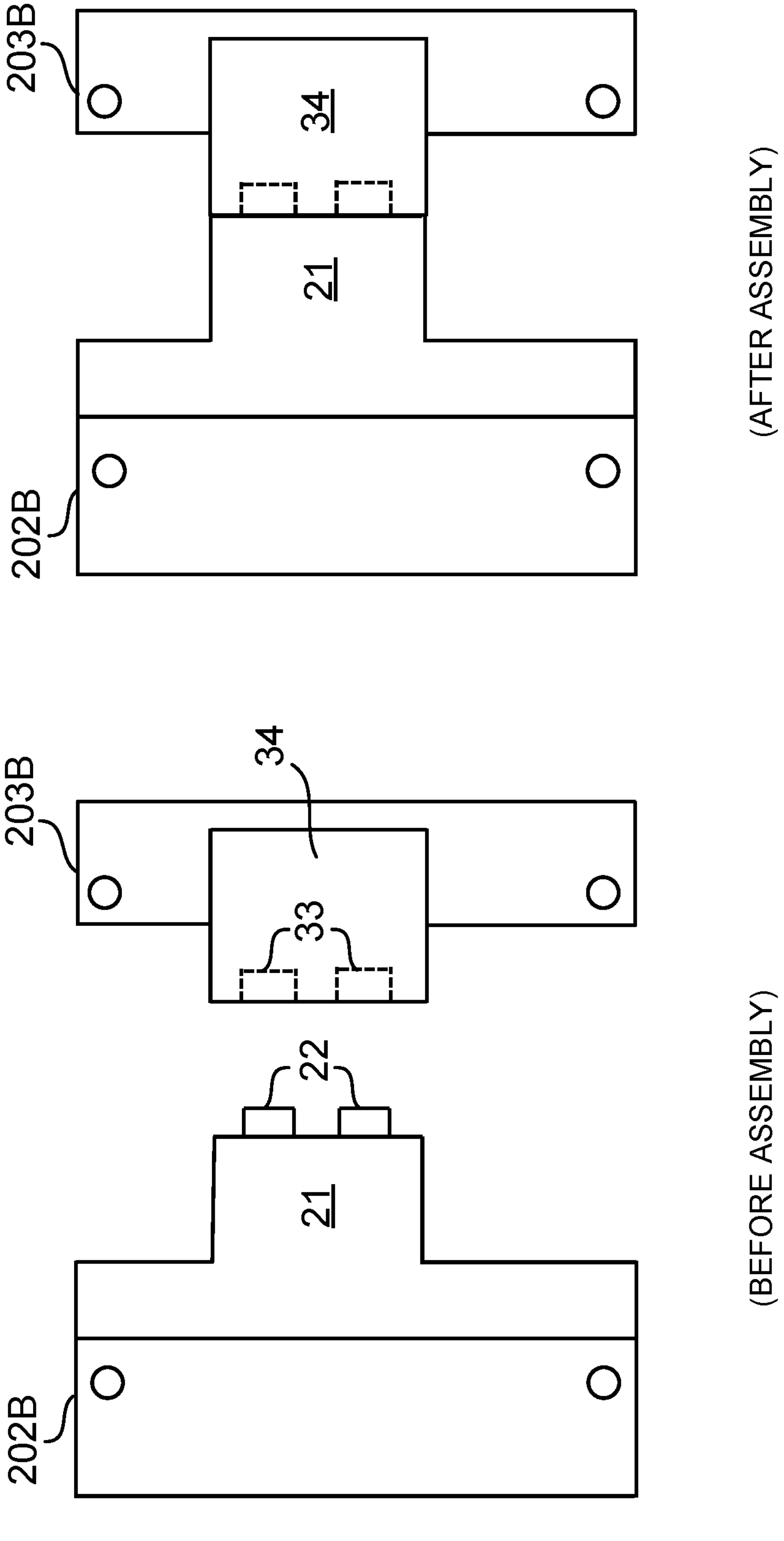
FIG. 9 shows a top view of a heat spreader 202B and a heat spreader 203B before and after assembly in accordance with another embodiment of the present invention.

FIG. 9 shows, from left to right, a top view of a heat spreader 202B and a heat spreader 203B before and after assembly in accordance with another embodiment of the present invention. In the example of FIG. 9, the heat spreader 203B has an insertion portion 34 inserted between the bottom surface of the main body 61 and topmost surfaces of the first plurality of power ICs 207, and the insertion portion 34 is in contact with the insertion portion 21 through the TIM 251. In one embodiment, the heat spreader 202B has at least one plug structure 22 disposed at the leading end of the insertion portion 21, and the heat spreader 203B has at least one socket 33 corresponding to the at least one plug structure 22, and the at least one socket 33 is disposed at a leading end of the insertion portion 34. The insertion portion 34 and the insertion portion 21 is on a same horizontal plane to assemble the heat spreaders 202B and 203B through the at least one plug structure 22 and the at least one socket 33. As shown in FIG. 9, after assembly, each plug structure 22 is inserted into the corresponding socket 33, and is in contact with the corresponding socket 33 through the TIM 251. In the example of FIG. 9, the heat spreader 202B has two plug structures 22, and the heat spreader 203B has two sockets 33 corresponding to the two plug structures 22. One with ordinary skill in the art should understand that the number and detailed structure of the at least one plug structure 22 and the at least one socket 33 is not limited by the example of FIG. 9. In another embodiment, the heat spreader 202B may have only one plug structure 22 or more than two plug structures 22, and the heat spreader 203B may correspondingly have one socket 33 or more than two sockets 33. One with ordinary skill in the art should understand that the assembly method of the heat spreaders 202 and 203 is not limited by the examples of FIG. 8 and FIG. 9, any suitable assembly method may also be employed without detracting merits of the present invention. For example, the heat spreaders 202 and 203 may also be integrated together before assembly.

Figure 10:
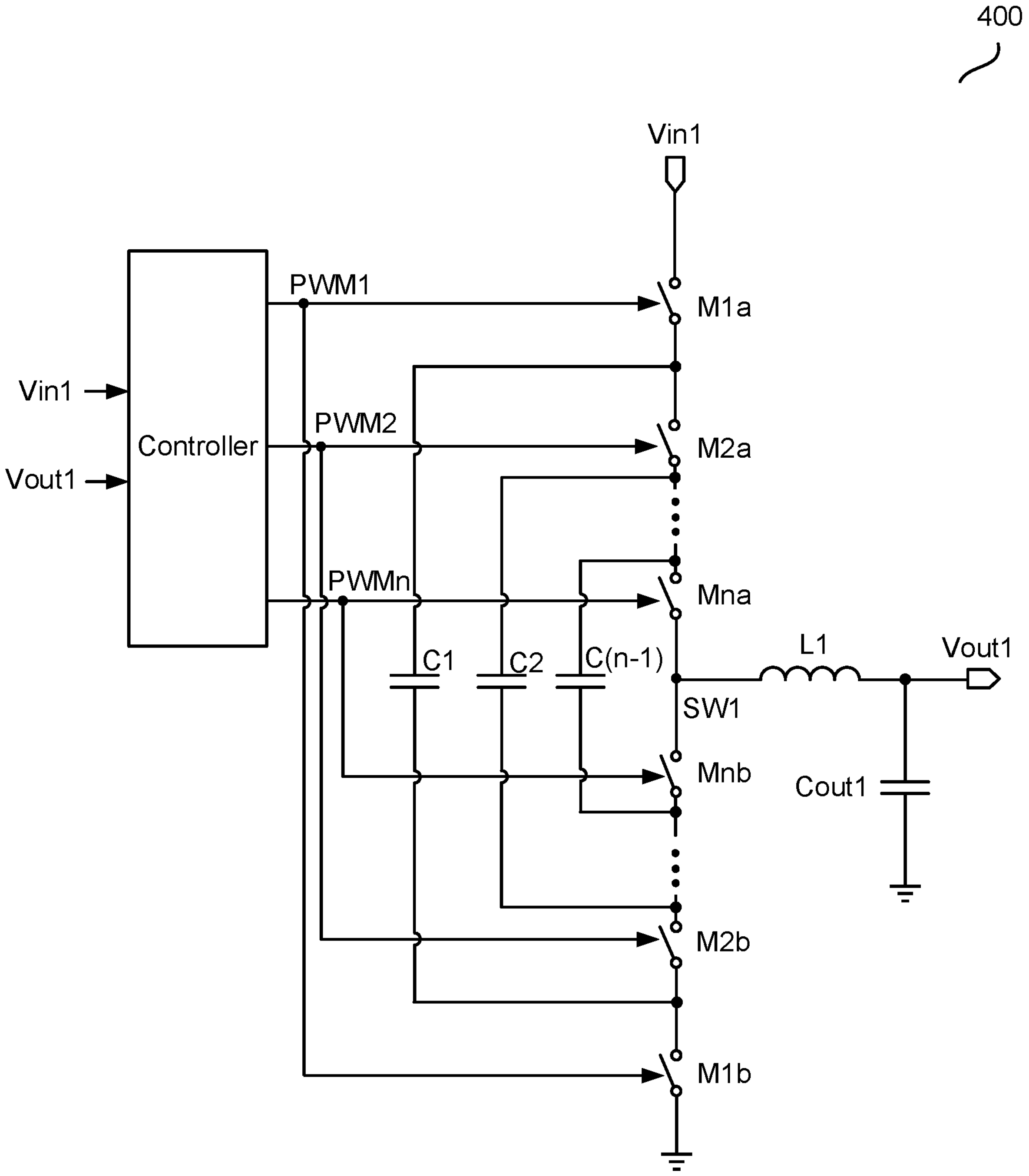
FIG. 10 schematically shows a circuit diagram 400 of the power module 200 in accordance with an embodiment of the present invention.

FIG. 10 schematically shows a circuit diagram 400 of the power module 200 in accordance with an embodiment of the present invention. The circuit diagram 400 is a multi-level buck converter comprising an inductor L1, an output capacitor Cout1, and a plurality of switches M1*a*-Mna and M1*b*-

Mnb. The multi-level buck converter shown in FIG. 10 further comprises a plurality of fly capacitors C1, C2, . . . , C(n−1). The fly capacitor Ci (i=1, 2, . . . , n−1) is coupled between a common node formed by the switch Mia and the switch M(i+1) a and a common node formed by the switch Mib and the switch M(i+1) b. E.g., the fly capacitor C1 is coupled between a common node formed by the switch M1*a* and the switch M2*a* and a common node formed by the switch M1*b* and the switch M2*b*. When the circuit diagram 400 is implemented by the power module 200, the inductor L1 is implemented by the inductor assembly 206, and the switches M1*a*-Mna and M1*b*-Mnb are implemented by the plurality of power ICs 207 and 208. In the example of FIG. 10, the switches Mna and Mnb are coupled together to form a switch node SW1, a first end of the inductor L1 is coupled to the switch node SW1, and a second end of the inductor L1 is coupled to the output capacitor Cout1 to provide an output voltage Vout1.

Figure 11:
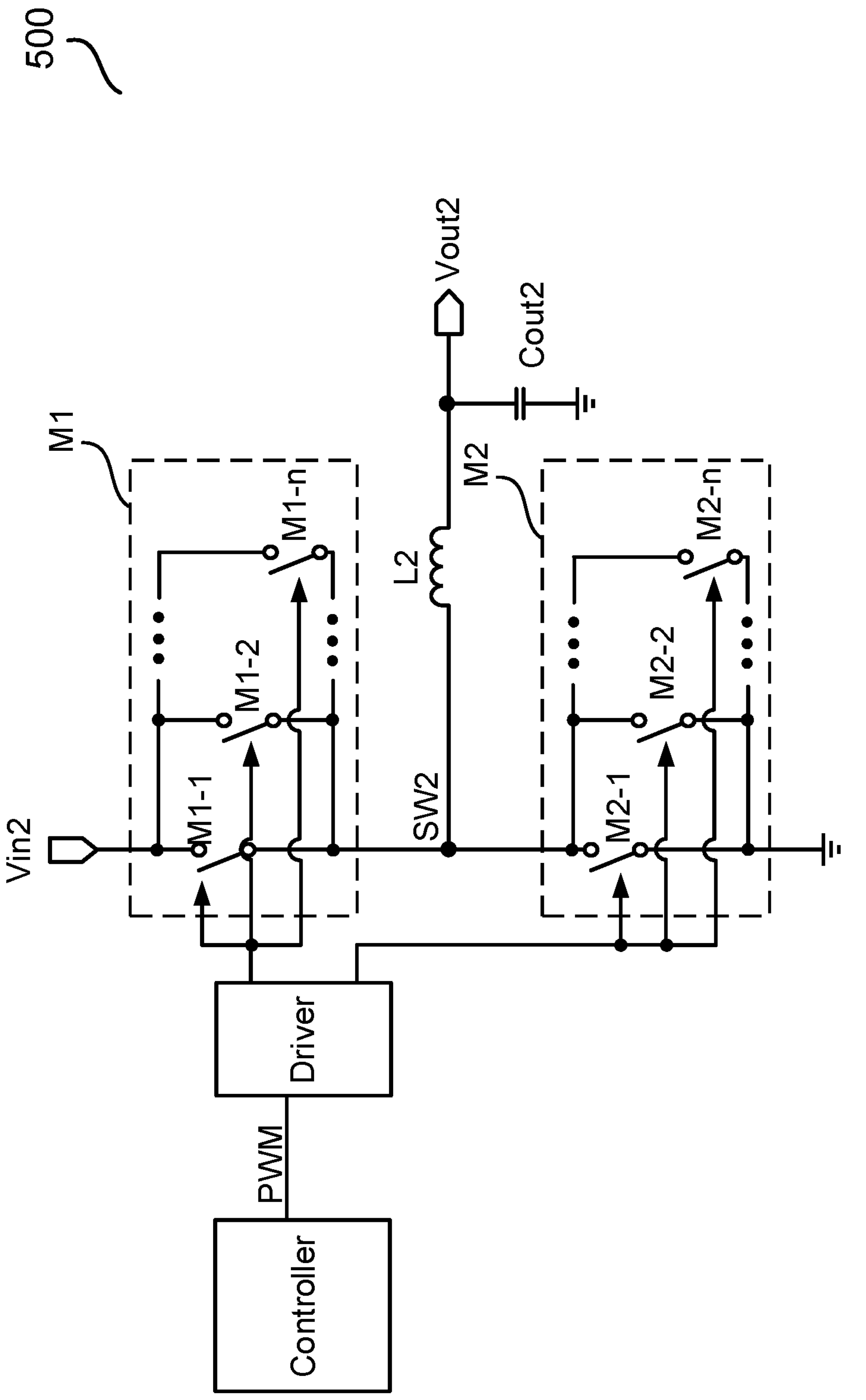
FIG. 11 schematically shows a circuit diagram 500 of the power module 200 in accordance with another embodiment of the present invention.

FIG. 11 schematically shows a circuit diagram 500 of the power module 200 in accordance with another embodiment of the present invention. The circuit diagram 500 is a buck converter for high current applications. As shown in FIG. 11, a plurality of switches M1-1, M1-2, . . . , and M1-*n* are coupled in parallel to form a high side switch M1 of the buck converter to provide a higher current to a load, and similarly, a plurality of switches M2-1, M2-2, . . . , and M2-*n* are coupled in parallel to form a low side switch M2 of the buck converter. The buck converter shown in FIG. 11 further comprises an inductor L2 and an output capacitor Cout2. When the circuit diagram 500 is implemented by the power module 200, the inductor L2 is implemented by the inductor assembly 206, and the switches M1-1-M1-*n* and M2-1-M2-*n* are implemented by the plurality of power ICs 207 and 208. In the example of FIG. 11, the high side switch M1 and the low side switch M2 are coupled together to form a switch node SW2, a first end of the inductor L2 is coupled to the switch node SW1, and a second end of the inductor L2 is coupled to the output capacitor Cout2 to provide an output voltage Vout2. One with ordinary skill in the art should understand that the circuit diagram of the power module 200 is not limited by the examples of FIG. 10 and FIG. 11, any suitable circuit diagram may also be employed without detracting merits of the present invention.

Figure 12:
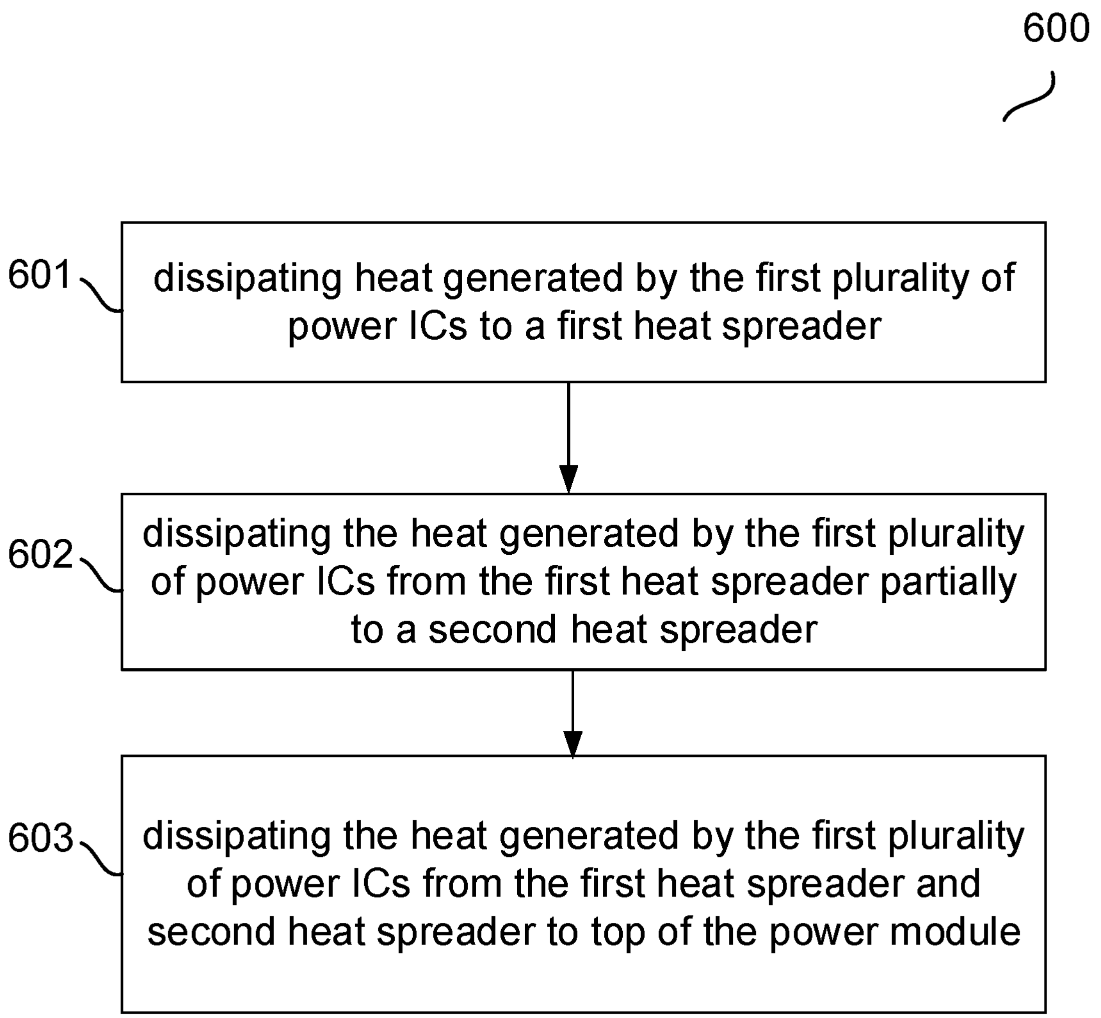
FIG. 12 illustrates a heat dissipation method 600 for a power module in accordance with an embodiment of the present invention.

FIG. 12 illustrates a heat dissipation method 600 for a power module in accordance with an embodiment of the present invention. The power module comprises a substrate having a first surface and a second surface, a first plurality of power integrated circuits (ICs) mounted on the first surface of the substrate and an inductor assembly mounted on the first surface of the substrate. The inductor assembly has an inductor main body placed above the power ICs. The heat dissipation method 600 comprises steps 601-603.

In step 601, dissipating at least a portion of heat generated by the first plurality of power ICs to a first heat spreader.

In step 602, dissipating the at least a portion of the heat generated by the first plurality of power ICs from the first heat spreader partially to a second heat spreader. Wherein the first heat spreader has an insertion portion inserted between the main body of the inductor assembly and the first plurality of power ICs, and the insertion portion is in contact with the second heat spreader.

In step 603, dissipating the at least a portion of the heat generated by the first plurality of power ICs from the first heat spreader and second heat spreader to top of the power module. Wherein the first heat spreader is in contact with the second heat spreader through a thermal interface material (TIM), and the first heat spreader is in contact with the second heat spreader through the TIM. In one embodiment, the at least a portion of the heat generated by the first plurality of power ICs is finally dissipated to top of the power module without passing the inductor assembly. In one embodiment, at least 70% of the heat generated by the first plurality of power ICs is finally dissipated to top of the power module without passing the inductor assembly.

In one embodiment, the power module further comprises a second plurality of power ICs and a third heat spreader mounted on the second surface of the substrate, and the heat dissipation method 600 further comprises dissipating at least a portion of heat generated by the second plurality of power ICs to the third heat spreader. The third heat spreader is in contact with the second plurality of power ICs through the TIM.

In one embodiment, the heat dissipation method 600 further comprises dissipating at least a portion of heat generated by the inductor assembly to a fourth heat spreader disposed on top of the power module, and dissipating the at least a portion of the heat generated by the first plurality of power ICs from the first heat spreader and second heat spreader to top of the power module further comprises dissipating the at least a portion of the heat generated by the first plurality of power ICs from the first heat spreader and second heat spreader to the fourth heat spreader. The fourth heat spreader is in contact with the inductor assembly, the second heat spreader, and the third heat spreader through the TIM.

Obviously many modifications and variations of the present invention are possible in light of the above teachings. It is therefore to be understood that within the scope of the appended claims the invention may be practiced otherwise than as specifically described. It should be understood, of course, the foregoing disclosure relates only to a preferred embodiment (or embodiments) of the invention and that numerous modifications may be made therein without departing from the spirit and the scope of the invention as set forth in the appended claims. Various modifications are contemplated and they obviously will be resorted to by those skilled in the art without departing from the spirit and the scope of the invention as hereinafter defined by the appended claims as only a preferred embodiment(s) thereof has been disclosed.

What is claimed is:

1. A power module, comprising:

a substrate having a first surface and a second surface;

a first plurality of power integrated circuits (ICs) mounted on the first surface of the substrate;

a second plurality of power ICs mounted on the second surface of the substrate;

an inductor assembly having a main body, a first terminal and a second terminal, the main body having a bottom surface facing the substrate and a top surface facing away from the substrate, wherein the first and second terminals of the inductor assembly extends from the main body and are connected to the first surface of the substrate, and wherein the inductor assembly is coupled to a switch node formed by the first and second plurality of power ICs;

a first heat spreader and a second heat spreader mounted on the first surface of the substrate, wherein the first plurality of power ICs are under the main body of the inductor assembly, and a distance between the bottom surface of the main body of the inductor assembly and the first surface of the substrate is larger than heights of the first plurality of power ICs, the first heat spreader having a first insertion portion inserted between the main body of the inductor assembly and the first plurality of power ICs, and wherein the first insertion portion is in contact with the second heat spreader through a thermal interface material (TIM); and a third heat spreader mounted on the second surface of the substrate to cover the second plurality of power ICs.

2. The power module of claim 1, further comprising a fourth heat spreader mounted on the first surface of the substrate, wherein the fourth heat spreader is in contact with the main body of the inductor assembly, the first heat spreader, and the second heat spreader through the TIM.

3. The power module of claim 1, wherein the first insertion portion of the first heat spreader has a bottommost surface in contact with the first plurality of ICs through the TIM.

4. The power module of claim 1, wherein the third heat spreader has an inner surface facing the substrate and an outer surface facing away from the substrate, and the inner surface of the third heat spreader is in contact with the second plurality of power ICs through the TIM.

5. The power module of claim 1, further comprising:

a plurality of gate driver ICs mounted on the substrate, wherein the plurality of gate driver ICs are configured to drive the first and second plurality of power ICs;

at least one low dropout regulator (LDO) IC mounted on the substrate;

a plurality of connectors mounted on the second surface of the substrate; and a plurality of passive devices mounted on the substrate.

6. The power module of claim 5, further comprising a controller mounted on the substrate, wherein the controller is configured to control the first and second plurality of power ICs.

7. The power module of claim 1, wherein the substrate comprises a printed circuit board (PCB).

8. The power module of claim 7, wherein the PCB is fabricated using BT (bismaleimide triazine resin) material.

9. The power module of claim 1, wherein the first plurality of power ICs comprises a first plurality of metal oxide semiconductor field transistors (MOSFET), and the second plurality of power ICs comprises a second plurality of MOSFETs.

10. The power module of claim 1, wherein the inductor assembly comprises:

a magnetic core, having a channel formed inside of the magnetic core, wherein the channel forms a first window on a first side surface of the magnetic core and a second window on a second side surface of the magnetic core, and wherein the first and second side surfaces are opposite; and and a winding passing through the channel, wherein a first portion of the winding extends out of the magnetic core through the first window to form the first terminal of the inductor assembly, and a second portion of the winding extends out of the magnetic core through the second window to form the second terminal of the inductor assembly; and wherein the magnetic core and a third portion of the winding which is inside of the magnetic core form the main body of the inductor assembly.

11. A power module, comprising:

a substrate having a first surface and a second surface;

an inductor assembly having a main body, a first terminal and a second terminal, the main body having a bottom surface facing the first surface of the substrate surface and a top surface opposite to the bottom surface of the main body of the inductor assembly, wherein the first and second terminals of the inductor assembly extends from the main body of the inductor assembly and are connected to the first surface of the substrate;

a first plurality of power integrated circuits (ICs) mounted on the first surface of the substrate, wherein the first plurality of power ICs are under the main body of the inductor assembly, and a distance between the bottom surface of the main body of the inductor assembly and the first surface of the substrate is larger than heights of the first plurality of power ICs; and a first heat spreader and a second heat spreader mounted on the first surface of the substrate, wherein the first heat spreader has a first insertion portion inserted between the main body of the inductor assembly and the first plurality of power ICs, and wherein the first insertion portion is in contact with the second heat spreader through a thermal interface material (TIM).

12. The power module of claim 11, further comprising:

a second plurality of power ICs mounted on the second surface of the substrate;

a third heat spreader mounted on the second surface of the substrate to cover the second plurality of power ICs.

13. The power module of claim 11, further comprising:

a fourth heat spreader disposed on the top surface of the main body of the inductor assembly, wherein the fourth heat spreader is in contact with the main body of the inductor assembly, the first heat spreader, and the second heat spreader through the TIM.

14. The power module of claim 12, wherein:

the first insertion portion of the first heat spreader has a bottom surface in contact with the first plurality of ICs through the TIM; and the third heat spreader has an inner surface facing the substrate and an outer surface facing away from the substrate, and the inner surface of the third heat spreader is in contact with the second plurality of power ICs through the TIM.

15. The power module of claim 11, wherein:

the second heat spreader comprises a second insertion portion inserted between the main body of the inductor assembly and the first plurality of power ICs, and wherein the first insertion portion is in contact with the second insertion portion.

16. The power module of claim 11, wherein the first heat spreader and the second heat spreader are capable of dissipating at least a portion of heat generated by the first plurality of power ICs.

17. The power module of claim 11, wherein at least 70% of heat generated by the first plurality of power ICs is dissipated to top of the power module without passing the inductor assembly.

18. The power module of claim 12, wherein the third heat spreader is capable of dissipating at least a portion of heat generated by the second plurality of power ICs.

* * * * *